US012765358B2

(12) United States Patent
Lee et al.

(10) Patent No.: US 12,765,358 B2
(45) Date of Patent: Oct. 13, 2026

(54) SEMICONDUCTOR DEVICE

(71) Applicant: Samsung Electronics Co., Ltd., Suwon-si (KR)

(72) Inventors: Jung Han Lee, Suwon-si (KR); Jisoo Park, Suwon-si (KR); Byung-Sung Kim, Suwon-si (KR); Kwanyoung Chun, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 262 days.

(21) Appl. No.: 18/641,525

(22) Filed: Apr. 22, 2024

(65) Prior Publication Data

US 2025/0174559 A1 May 29, 2025

(30) Foreign Application Priority Data

Nov. 28, 2023 (KR) ........................ 10-2023-0168393

(51) Int. Cl.

| | |
|---|---|
| ***H10W 20/41*** | (2026.01) |
| ***H10D 30/43*** | (2025.01) |
| ***H10D 30/67*** | (2025.01) |
| ***H10D 62/10*** | (2025.01) |
| ***H10D 62/13*** | (2025.01) |

(Continued)

(52) U.S. Cl.

CPC .......... *H10W 20/427* (2026.01); *H10D 30/43* (2025.01); *H10D 30/6729* (2025.01); *H10D 30/6735* (2025.01); *H10D 30/6757* (2025.01); *H10D 62/121* (2025.01); *H10D 62/151* (2025.01); *H10D 84/851* (2025.01); *H10D 84/856* (2025.01); *H10D 88/00* (2025.01)

(58) Field of Classification Search

CPC .. H10W 20/427; H10W 20/435; H10D 30/43; H10D 30/6729; H10D 30/6735; H10D 30/6757; H10D 62/121; H10D 62/151; H10D 84/851; H10D 84/856; H10D 88/00; H10D 84/0153; H10D 84/0188; H10D 88/01; H10D 84/0186

See application file for complete search history.

(56) References Cited

U.S. PATENT DOCUMENTS 9,362,397 B2 * 6/2016 Hur ...................... H10D 30/026
10,970,451 B2 4/2021 Li et al.

(Continued)

*Primary Examiner* — Andres Munoz
(74) *Attorney, Agent, or Firm* — Harness, Dickey & Pierce, P.L.C.

(57) ABSTRACT

Disclosed is a semiconductor device comprising a first upper power line and a second upper power line extending in a first direction and are spaced apart from each other in a second direction intersecting the first direction, a first semiconductor pattern, a second semiconductor pattern spaced apart in the second direction from the first semiconductor pattern, a third semiconductor pattern spaced apart in the second direction from the second semiconductor pattern, a fourth semiconductor pattern spaced apart in the first direction from the first semiconductor pattern, and a fifth semiconductor pattern spaced apart in the first direction from the third semiconductor pattern. The first to fifth semiconductor patterns are between the first upper power line and the second upper power line. The second semiconductor pattern is between the first semiconductor pattern and the third semiconductor pattern.

20 Claims, 10 Drawing Sheets

(51) Int. Cl.
*H10D 84/85* (2025.01)
*H10D 88/00* (2025.01)

(56) References Cited

U.S. PATENT DOCUMENTS

| | | | | |
|---|---|---|---|---|
| 11,107,805 | B2 | 8/2021 | Li et al. | |
| 11,664,380 | B2 | 5/2023 | Wu et al. | |
| 11,727,184 | B2 | 8/2023 | Lee et al. | |
| 2018/0026032 | A1* | 1/2018 | Yoon | H10D 30/797<br>257/401 |
| 2018/0151728 | A1* | 5/2018 | Heo | H10D 84/038 |
| 2018/0358346 | A1* | 12/2018 | Kim | H10D 62/116 |
| 2021/0104611 | A1* | 4/2021 | Yu | H10D 30/6219 |
| 2022/0059460 | A1* | 2/2022 | Do | H10W 20/427 |
| 2022/0085006 | A1* | 3/2022 | Kim | H10D 89/10 |
| 2022/0181322 | A1 | 6/2022 | Liebmann et al. | |
| 2023/0075320 | A1* | 3/2023 | Chung | H10D 30/6748 |
| 2023/0120551 | A1 | 4/2023 | Lee et al. | |
| 2023/0253406 | A1 | 8/2023 | Wu et al. | |

* cited by examiner

SEMICONDUCTOR DEVICE

CROSS-REFERENCE TO RELATED APPLICATION

This U.S. nonprovisional application claims priority under 35 U.S.C. § 119 to Korean Patent Application No. 10-2023-0168393 filed on Nov. 28, 2023 in the Korean Intellectual Property Office, the disclosure of which is hereby incorporated by reference in its entirety.

BACKGROUND

The present inventive concepts relate to a semiconductor device, and more particularly, to a semiconductor device including an upper source/drain pattern and a lower source/drain pattern.

A semiconductor device includes an integrated circuit including metal oxide semiconductor field effect transistors (MOSFETs). As sizes and design rules of the semiconductor device are gradually decreased, sizes of the MOSFETs are also increasingly scaled down. The scale down of MOSFETs may deteriorate operating characteristics of the semiconductor device. Accordingly, various studies have been conducted to develop methods of fabricating semiconductor devices having superior performances while overcoming limitations caused by high integration of the semiconductor devices.

SUMMARY

Some example embodiments of the present inventive concepts provide a semiconductor device with improved electrical properties and increased reliability.

According to some example embodiments of the present inventive concepts, a semiconductor device may comprise a first upper power line and a second upper power line extending in a first direction and are spaced apart from each other in a second direction intersecting the first direction, a first semiconductor pattern, a second semiconductor pattern spaced apart in the second direction from the first semiconductor pattern, a third semiconductor pattern spaced apart in the second direction from the second semiconductor pattern, a fourth semiconductor pattern spaced apart in the first direction from the first semiconductor pattern, and a fifth semiconductor pattern spaced apart in the first direction from the third semiconductor pattern. The first to fifth semiconductor patterns are between the first upper power line and the second upper power line. The second semiconductor pattern is between the first semiconductor pattern and the third semiconductor pattern. A distance between the first semiconductor pattern and the third semiconductor pattern is greater than a distance between the fourth semiconductor pattern and the fifth semiconductor pattern.

According to some example embodiments of the present inventive concepts, a semiconductor device may comprise a first semiconductor pattern, a second semiconductor pattern and a third semiconductor pattern overlapping in a first direction with the first semiconductor pattern, a fourth semiconductor pattern overlapping in a second direction with the first semiconductor pattern, the second direction intersecting the first direction, and a fifth semiconductor pattern overlapping in the second direction with the third semiconductor pattern. The second semiconductor pattern is between the first semiconductor pattern and the third semiconductor pattern. A width in the first direction of each of the first to third semiconductor patterns is less than a width in the first direction of each of the fourth and fifth semiconductor patterns.

According to some example embodiments of the present inventive concepts, a semiconductor device may comprise a first source/drain structure, a first semiconductor pattern contacting the first source/drain structure, a first gate electrode overlapping the first semiconductor pattern, a second source/drain structure spaced apart in a first direction from the first source/drain structure, a second semiconductor pattern contacting the second source/drain structure, a second gate electrode overlapping the second semiconductor pattern, a third source/drain structure spaced apart in the first direction from the second source/drain structure, a third semiconductor pattern contacting the third source/drain structure, a third gate electrode overlapping the third semiconductor pattern, a fourth source/drain structure spaced apart in a second direction from the first source/drain structure, the second direction intersecting the first direction, a fourth semiconductor pattern contacting the fourth source/drain structure, a fourth gate electrode overlapping the fourth semiconductor pattern, a fifth source/drain structure spaced apart in the second direction from the third source/drain structure, a fifth semiconductor pattern contacting the fifth source/drain structure, a fifth gate electrode overlapping the fifth semiconductor pattern, a first gate separation layer between the first gate electrode and the second gate electrode, a second gate separation layer between the second gate electrode and the third gate electrode, and a third gate separation layer between the fourth gate electrode and the fifth gate electrode. Each of the first to fifth source/drain structures includes an upper source/drain pattern and a lower source/drain pattern. The third gate separation layer is between the first gate separation layer and the second gate separation layer.

DETAILED DESCRIPTION

Figure 1:
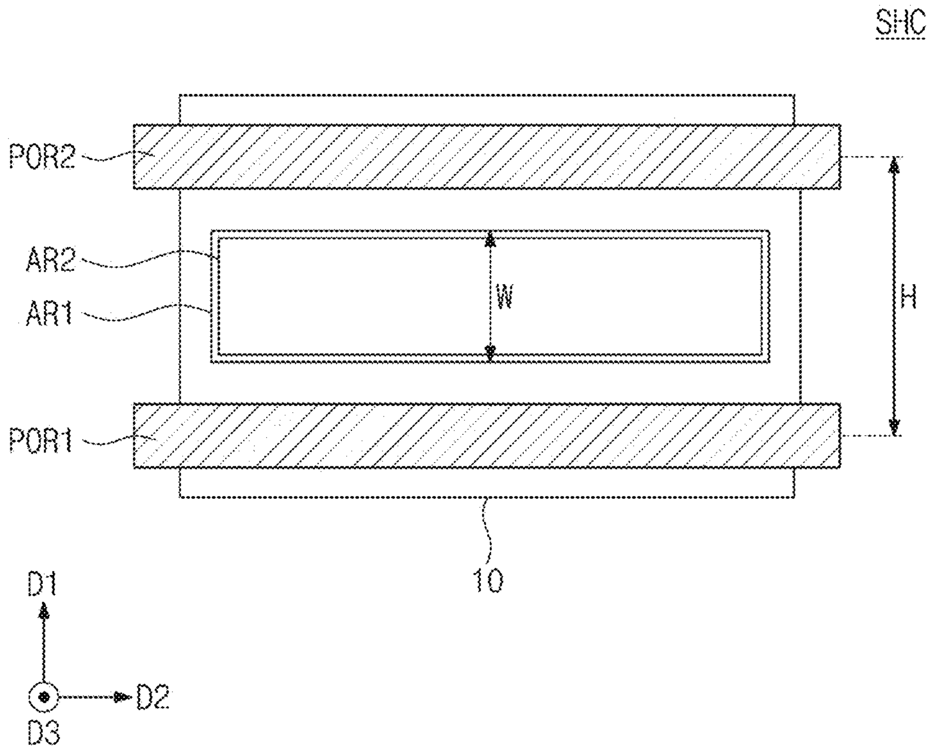
FIG. 1 illustrates a conceptual diagram showing a logic cell of a semiconductor device according to some example embodiments.

FIG. 1 illustrates a conceptual diagram showing a logic cell of a semiconductor device according to some example embodiments.

Referring to FIG. 1, a single height cell SHC may be provided which includes a three-dimensional device such as a stacked transistor. For example, a substrate 10 may be provided thereon with a first power line POR1 and a second power line POR2. The single height cell SHC may be defined between the first power line POR1 and the second power line POR2.

The single height cell SHC may include a first active region AR1 as a bottom tier and a second active region AR2 as a top tier. In some example embodiments, NMOSFETs of the first active region AR1 may be provided on the substrate 10, and PMOSFETs of the second active region AR2 may be stacked on the NMOSFETs of the first active region AR1. In some example embodiments, PMOSFETs of the first active region AR1 may be provided on the substrate 10, and NMOSFETs of the second active region AR2 may be stacked on the PMOSFETs of the first active region AR1.

As the first active region AR1 and the second active region AR2 are vertically stacked, each of the first and second active regions AR1 and AR2 may have a relatively small width W in a first direction D1, and the single height cell SHC may have a relatively small length H in the first direction D1.

Figure 2A:
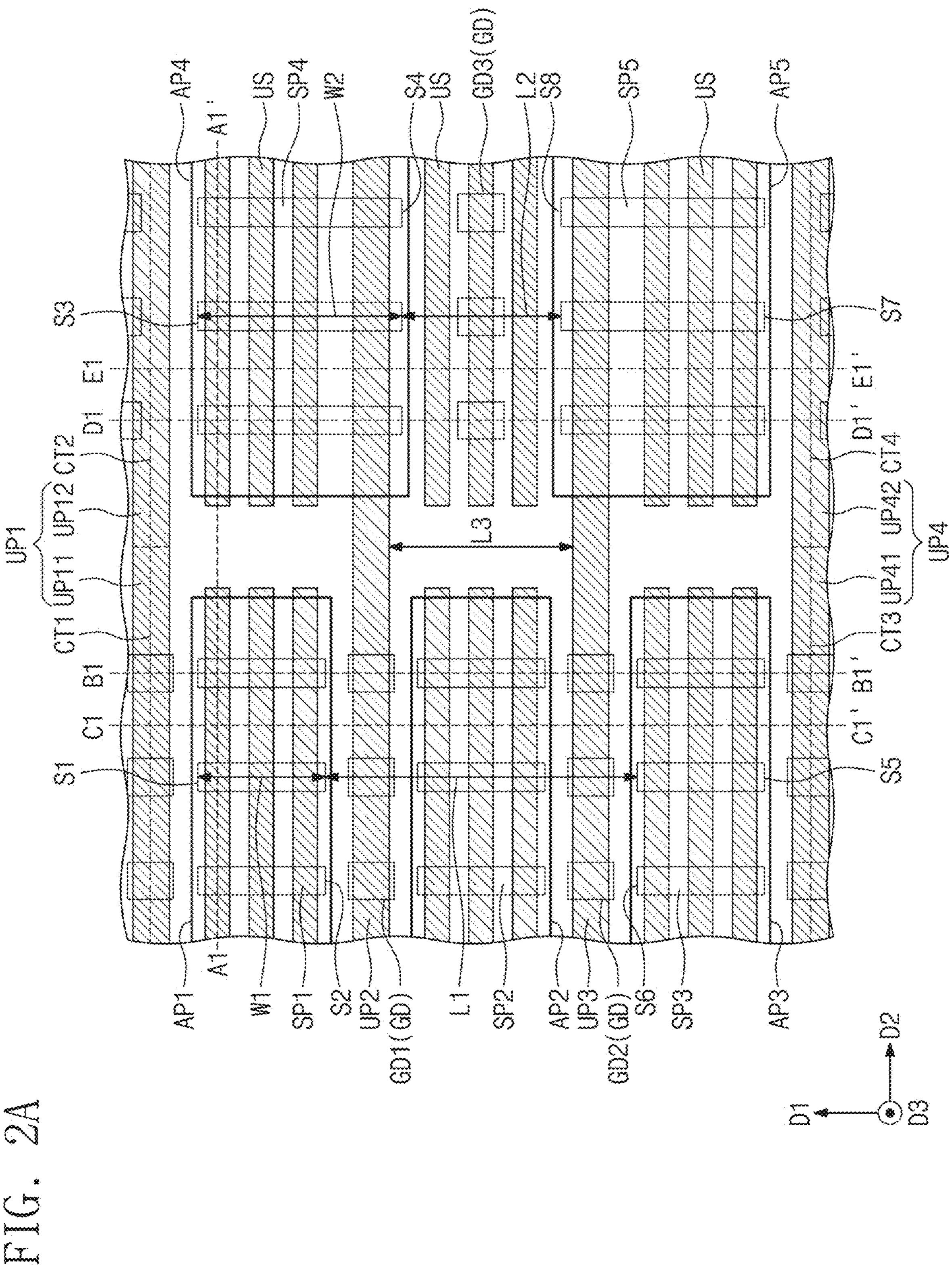
FIG. 2A illustrates a plan view showing a semiconductor device according to some example embodiments.
Figure 2B:
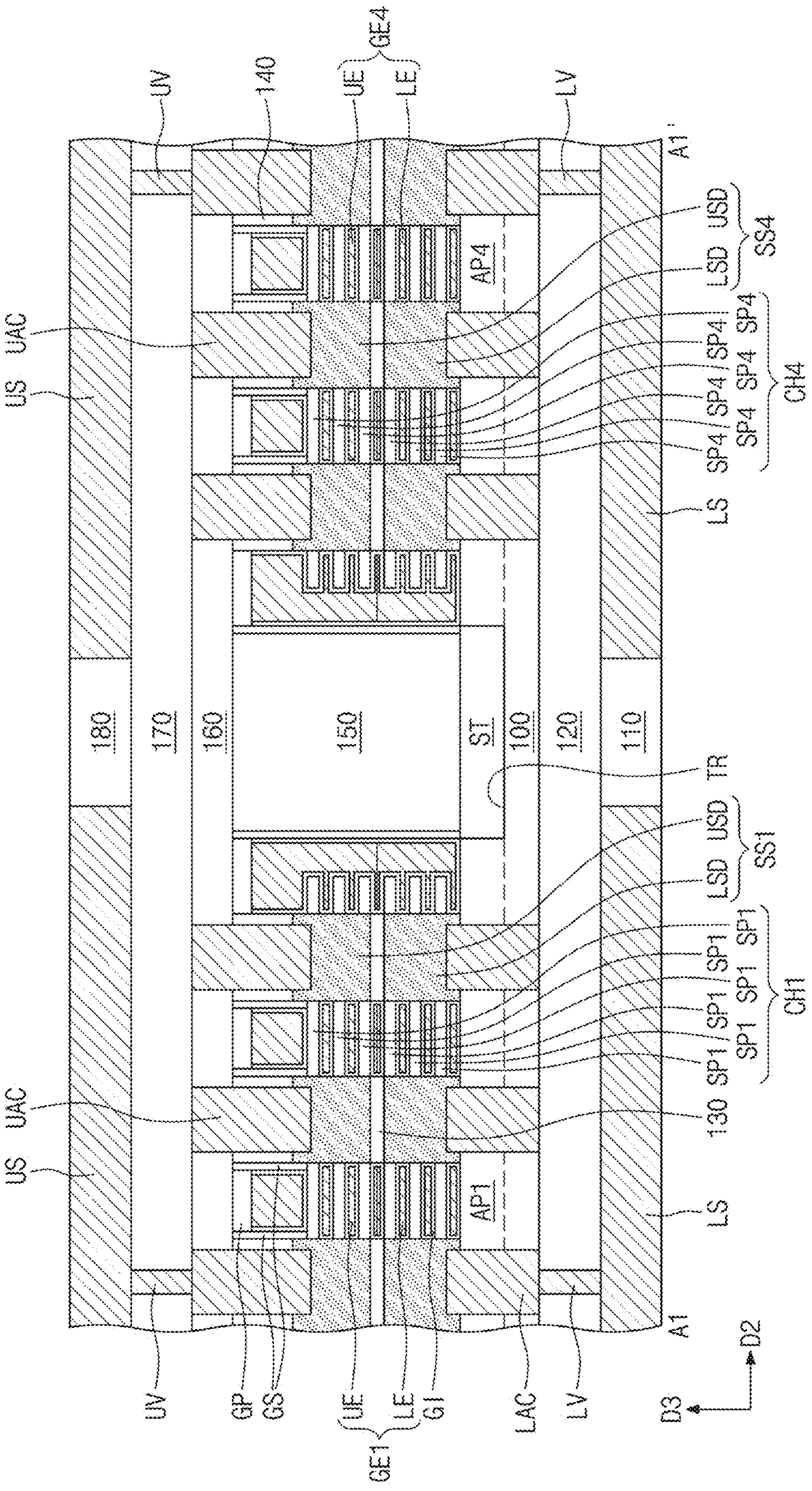
FIG. 2B illustrates a cross-sectional view taken along line A1-A1' of FIG. 2A.
Figure 2C:
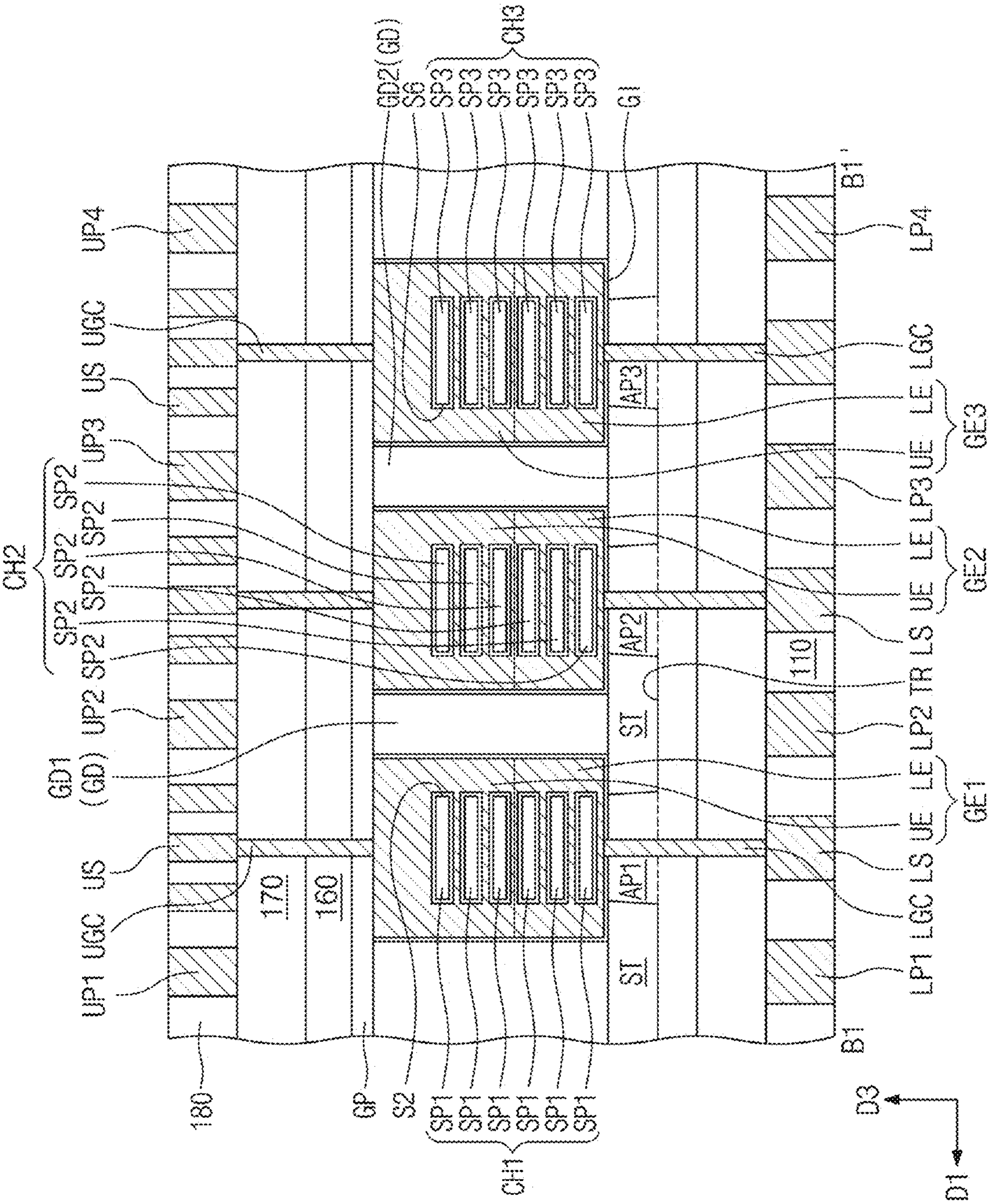
FIG. 2C illustrates a cross-sectional view taken along line B1-B1' of FIG. 2A.
Figure 2D:
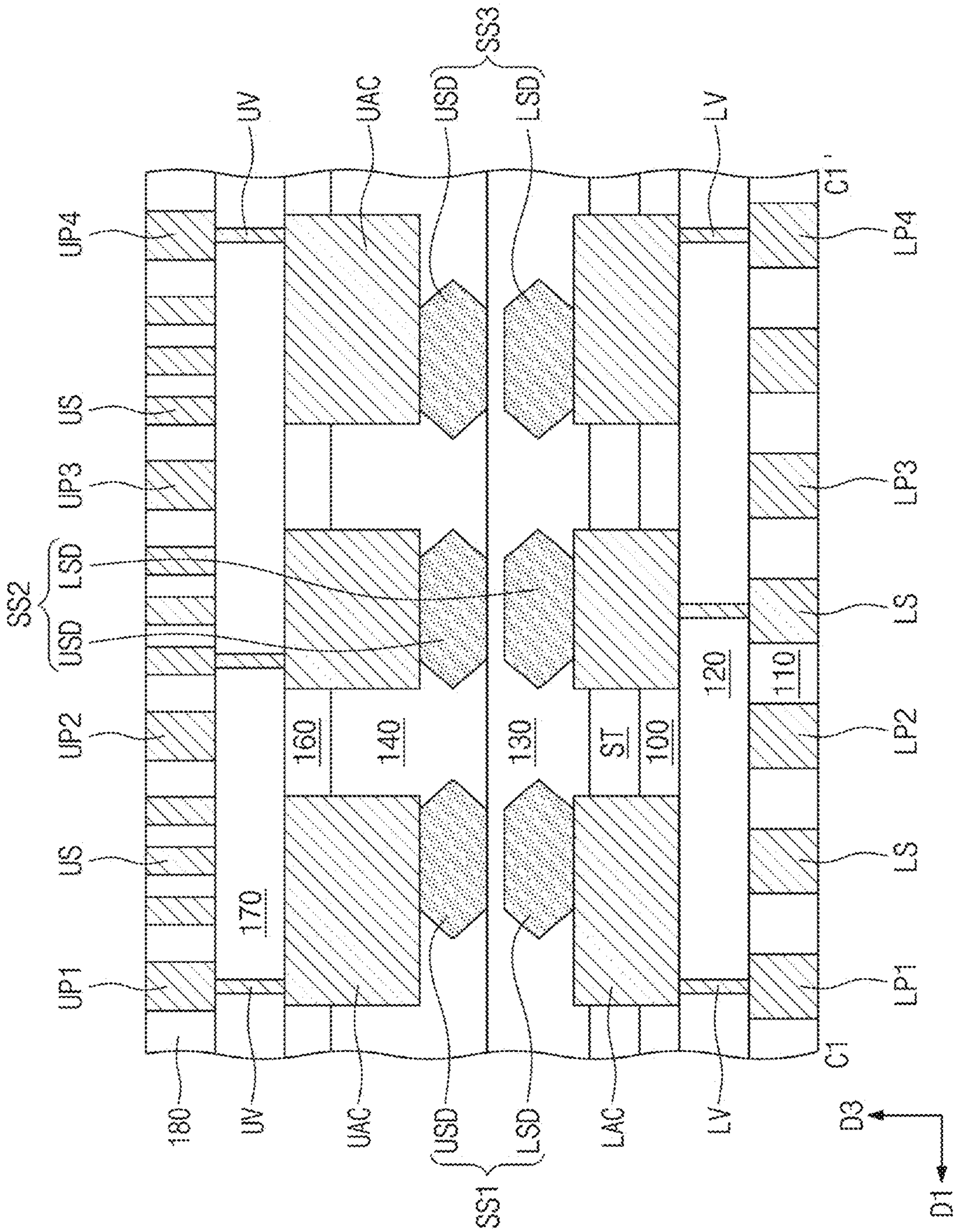
FIG. 2D illustrates a cross-sectional view taken along line C1-C1' of FIG. 2A.
Figure 2E:
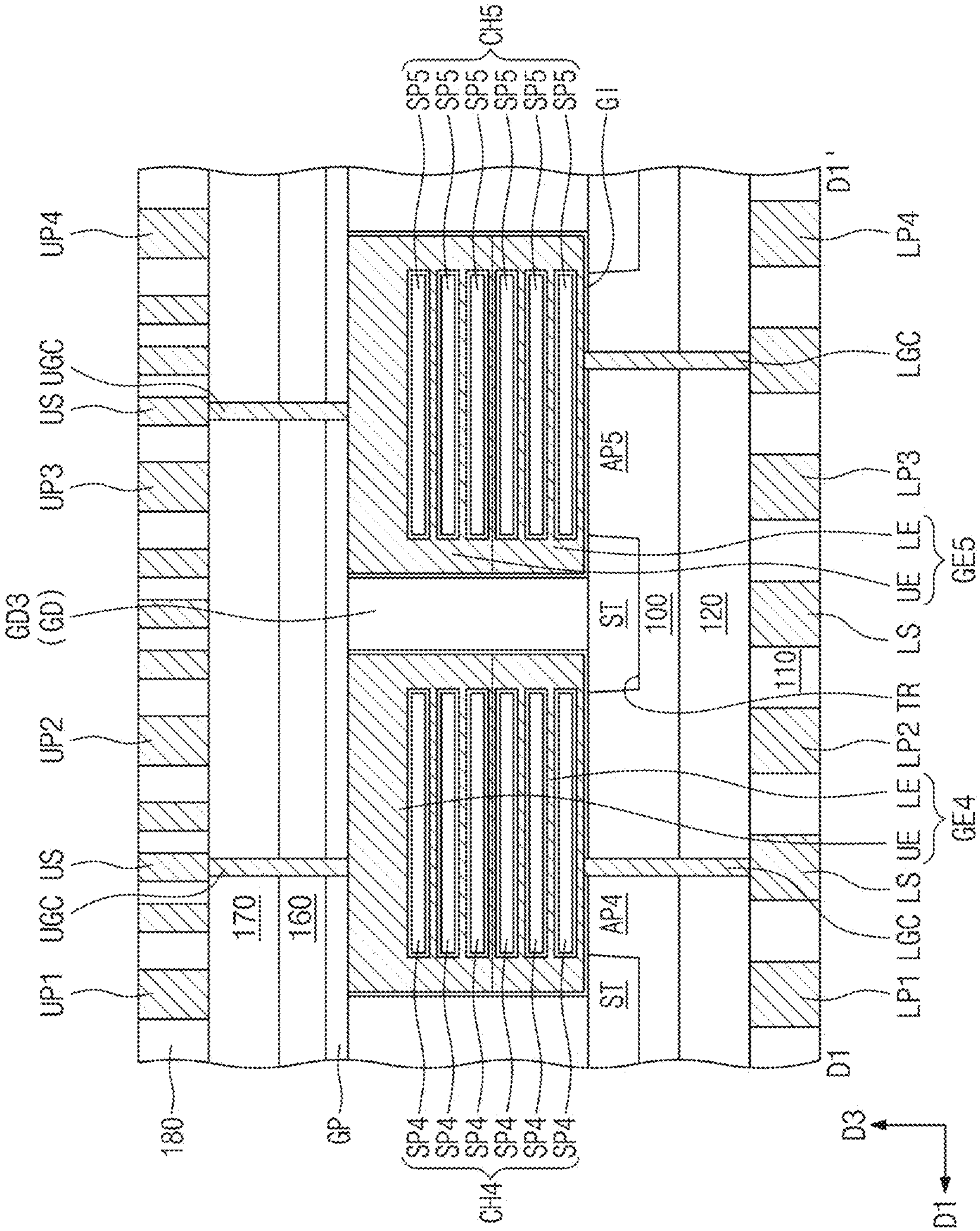
FIG. 2E illustrates a cross-sectional view taken along line D1-D1' of FIG. 2A.
Figure 2F:
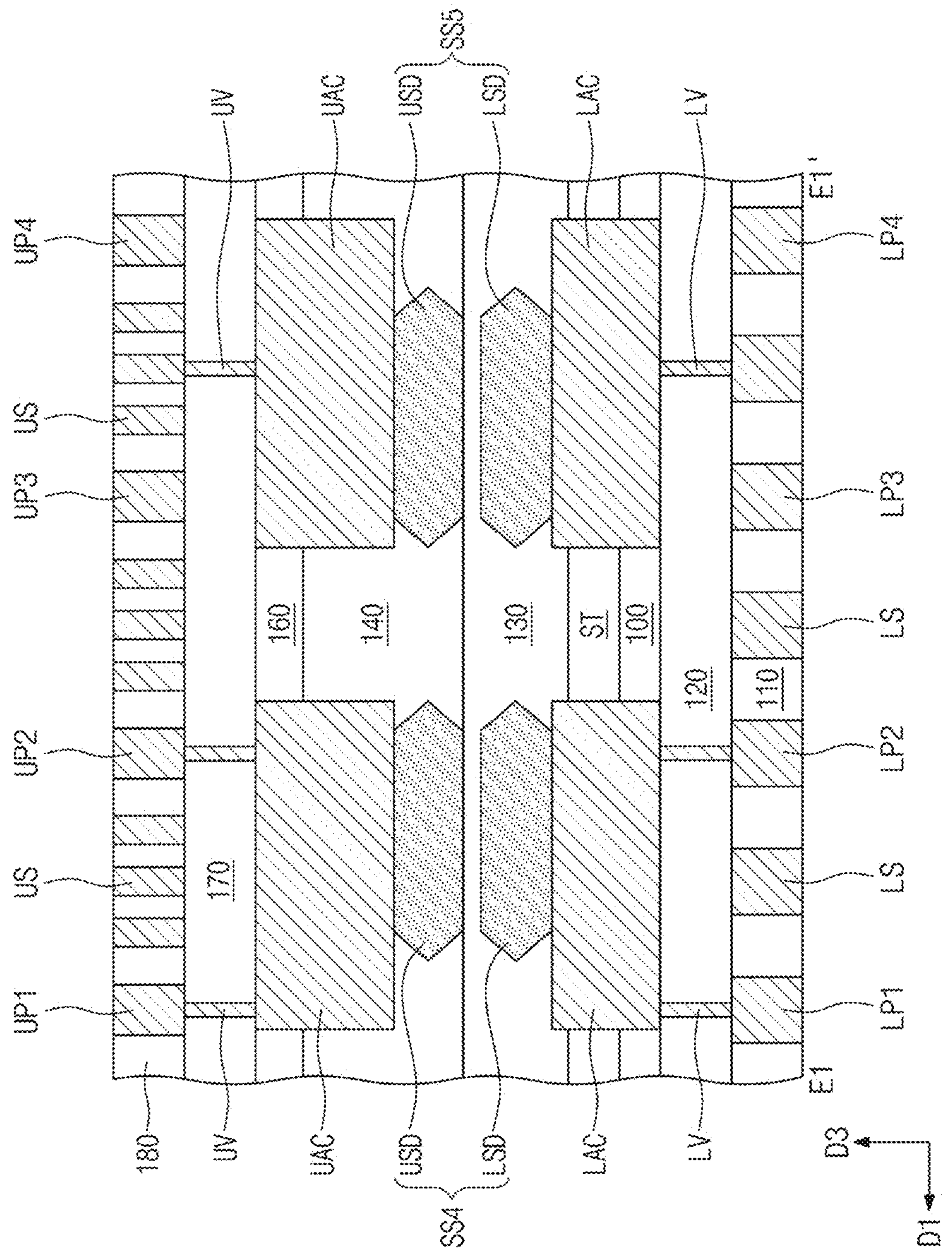
FIG. 2F illustrates a cross-sectional view taken along line E1-E1' of FIG. 2A.

FIG. 2A illustrates a plan view of the first and second active regions AR1 and AR2 of FIG. 1 showing a semiconductor device according to some example embodiments. FIG. 2B illustrates a cross-sectional view taken along line A1-A1' of FIG. 2A. FIG. 2C illustrates a cross-sectional view taken along line B1-B1' of FIG. 2A. FIG. 2D illustrates a cross-sectional view taken along line C1-C1' of FIG. 2A. FIG. 2E illustrates a cross-sectional view taken along line D1-D1' of FIG. 2A. FIG. 2F illustrates a cross-sectional view taken along line E1-E1' of FIG. 2A.

Referring to FIGS. 2A to 2F, a semiconductor device may include a first lower dielectric layer 110. The first lower dielectric layer 110 may include a dielectric material.

Referring to the cross sectional views of 2B to 2F, the layers including the lower active contacts LAC, lower electrodes LE, lower source/drain pattern LSD, lower vias LV, second lower dielectric layer 120, and first interlayer dielectric layer 130, may constitute the first active region AR1 of FIG. 1. Layers including the upper active contacts UAC, upper electrodes UE, upper source/drain pattern USD, upper vias UV, second upper dielectric layer 170, and second interlayer dielectric layer 140, may constitute the second active region AR2 of FIG. 1.

The first lower dielectric layer 110 may be provided therein with a first lower power line LP1, a second lower power line LP2, a third lower power line LP3, a fourth lower power line LP4, and lower signal lines LS. The second and third lower power lines LP2 and LP3 may be disposed between the first and fourth lower power lines LP1 and LP4. The first, second, third, and fourth lower power lines LP1, LP2, LP3, and LP4 and the lower signal lines LS may include a conductive material.

The first, second, third, and fourth lower power lines LP1, LP2, LP3, and LP4 and the lower signal lines LS may be alternately arranged along a first direction D1. The first, second, third, and fourth lower power lines LP1, LP2, LP3, and LP4 and the lower signal lines LS may extend in a second direction D2. The first direction D1 and the second direction D2 may intersect each other. For example, the first direction D1 and the second direction D2 may be horizontal directions that are orthogonal to each other.

One lower signal line LS may be disposed between two neighboring ones of the lower power lines LP1, LP2, LP3, and LP4, which two neighboring lower power lines are adjacent to each other in the first direction D1. For example, one lower signal line LS may be disposed between the first and second lower power lines LP1 and LP2. In some example embodiments, a plurality of lower signal lines LS may be disposed between two neighboring ones of the lower power lines LP1, LP2, LP3, and LP4, which two neighboring lower power lines are adjacent to each other in the first direction D1.

A second lower dielectric layer 120 may be provided on the first lower dielectric layer 110. The second lower dielectric layer 120 may include a dielectric material.

A substrate 100 may be provided on the second lower dielectric layer 120. The substrate 100 may be a semiconductor substrate, a dielectric substrate, a silicon-on-insulator (SOI) substrate, or a germanium-on-insulator (GOI) substrate. For example, the substrate 100 may include silicon (Si), germanium (Ge), silicon-germanium (SiGe), gallium-phosphorus (GaP), or gallium-arsenic (GaAs). However, example embodiments are not limited thereto.

The substrate 100 may include a first active pattern AP1, a second active pattern AP2, a third active pattern AP3, a fourth active pattern AP4, and a fifth active pattern AP5. The first, second, third, fourth, and fifth active patterns AP1, AP2, AP3, AP4, and AP5 may be defined by a trench TR on the substrate 100. Each of the first, second, third, fourth, and fifth active patterns AP1, AP2, AP3, AP4, and AP5 may be an upper portion of the substrate 100, which upper portion protrudes in a third direction D3. The third direction D3 may intersect the first direction D1 and the second direction D2. For example, the third direction D3 may be a vertical direction perpendicular to the first direction D1 and the second direction D2.

The first, second, and third active patterns AP1, AP2, and AP3 may overlap each other in the first direction D1. In this description, the phrase "A and B overlap each other in an X direction" may mean that there is at least one straight line extending in an X direction while running across both of A and B. The fourth and fifth active patterns AP4 and AP5 may overlap each other in the first direction D1. The first and fourth active patterns AP1 and AP5 may overlap each other in the second direction D2. The third and fifth active patterns AP3 and AP5 may overlap each other in the second direction D2.

The first, second, and third active patterns AP1, AP2, and AP3 may be spaced apart from each other in the first direction D1. The second active pattern AP2 may be disposed between the first and third active patterns AP1 and AP3. The fourth and fifth active patterns AP4 and AP5 may be spaced apart from each other in the first direction D1. The first and fourth active patterns AP1 and AP4 may be spaced apart from each other in the second direction D2. The third and fifth active patterns AP3 and AP5 may be spaced apart from each other in the second direction D2.

A width in the first direction D1 of each of the first, second, and third active patterns AP1, AP2, and AP3 may be less than a width in the first direction D1 of each of the fourth and fifth active patterns AP4 and AP5. For example, the width in the first direction D1 of each of the fourth and fifth active patterns AP4 and AP5 may be about 1.5 times to about 3 times the width in the first direction D1 of each of the first, second, and third active patterns AP1, AP2, and AP3.

A device isolation layer ST may be provided on the substrate 100. The device isolation layer ST may fill the trench TR. The device isolation layer ST may include a dielectric material. For example, the device isolation layer ST may include oxide.

There may be provided first channel structures CH1 overlapping in the third direction D3 with the first active pattern AP1, second channel structures CH2 overlapping in the third direction D3 with the second active pattern AP2, third channel structures CH3 overlapping in the third direction D3 with the third active pattern AP3, fourth channel structures CH4 overlapping in the third direction D3 with the fourth active pattern AP4, and fifth channel structures CH5 overlapping in the third direction D3 with the fifth active pattern AP5. A plurality of first channel structures CH1 overlapping in the third direction D3 with the first active pattern AP1 may be spaced apart from each other in the second direction D2.

The first channel structure CH1 may include first semiconductor patterns SP1 overlapping each other in the third direction D3. The second channel structure CH2 may include second semiconductor patterns SP2 overlapping each other in the third direction D3. The third channel structure CH3 may include third semiconductor patterns SP3 overlapping each other in the third direction D3. The fourth channel structure CH4 may include fourth semiconductor patterns SP4 overlapping each other in the third direction D3. The fifth channel structure CH5 may include fifth semiconductor patterns SP5 overlapping each other in the third direction D3.

In some example embodiments, each of the first, second, third, fourth, and fifth semiconductor patterns SP1, SP2, SP3, SP4, and SP5 may include silicon (Si). For example, each of the first, second, third, fourth, and fifth semiconductor patterns SP1, SP2, SP3, SP4, and SP5 may include crystalline silicon. In some example embodiments, each of the first, second, third, fourth, and fifth semiconductor patterns SP1, SP2, SP3, SP4, and SP5 may include silicon-germanium (SiGe). However, example embodiments are not limited thereto.

The first, second, and third semiconductor patterns SP1, SP2, and SP3 may overlap each other in the first direction D1. The fourth and fifth semiconductor patterns SP4 and SP5 may overlap each other in the first direction D1. The first and fourth semiconductor patterns SP1 and SP4 may overlap each other in the second direction D2. The third and fifth semiconductor patterns SP3 and SP5 may overlap each other in the second direction D2.

The first, second, and third semiconductor patterns SP1, SP2, and SP3 may be spaced apart from each other in the first direction D1. The second semiconductor pattern SP2 may be interposed between the first and third semiconductor patterns SP1 and SP3. The fourth and fifth semiconductor patterns SP4 and SP5 may be spaced apart from each other in the first direction D1. The first and fourth semiconductor patterns SP1 and SP4 may be spaced apart from each other in the second direction D2. The third and fifth semiconductor patterns SP3 and SP5 may be spaced apart from each other in the second direction D2.

A width in the first direction D1 of each of the first, second, and third semiconductor patterns SP1, SP2, and SP3 may be less than a width in the first direction D1 of each of the fourth and fifth semiconductor patterns SP4 and SP5. A width W1 in the first direction D1 of the first semiconductor pattern SP1 may be less than a width W2 in the first direction D1 of the fourth semiconductor pattern SP4. For example, the width W2 in the first direction D1 of the fourth semiconductor pattern SP4 may be about 1.5 times to about 3 times the width W1 in the first direction D1 of the first semiconductor pattern SP1. The first, second, and third semiconductor patterns SP1, SP2, and SP3 may have the same width in the first direction D1. The fourth and fifth semiconductor patterns SP4 and SP5 may have the same width in the first direction D1.

A distance L1 in the first direction D1 between the first semiconductor pattern SP1 and the third semiconductor pattern SP3 may be greater than a distance L2 in the first direction D1 between the fourth semiconductor pattern SP4 and the fifth semiconductor pattern SP5.

There may be provided first gate electrodes GE1 overlapping in the third direction D3 with the first active pattern AP1, second gate electrodes GE2 overlapping in the third direction D3 with the second active pattern AP2, third gate electrodes GE3 overlapping in the third direction D3 with the third active pattern AP3, fourth gate electrodes GE4 overlapping in the third direction D3 with the fourth active pattern AP4, and fifth gate electrodes GE5 overlapping in the third direction D3 with the fifth active pattern AP5. A plurality of first gate electrodes GE1 overlapping in the third direction D3 with the first active pattern AP1 may be spaced apart from each other in the second direction D2. The gate electrode GE1, GE2, GE3, GE4, or GE5 may overlap in the third direction D3 with the semiconductor pattern SP1, SP2, SP3, SP4, or SP5. The gate electrode GE1, GE2, GE3, GE4, or GE5 may include a portion interposed between the semiconductor patterns SP1, SP2, SP3, SP4, or SP5 overlapping each other in the third direction D3.

Each of the gate electrodes GE1, GE2, GE3, GE4, and GE5 may include an upper electrode UE and a lower electrode LE. The upper electrode UE may be disposed on the lower electrode LE. The upper electrode UE and the lower electrode LE may include different conductive materials from each other.

The first, second, and third gate electrodes GE1, GE2, and GE3 may overlap each other in the first direction D1. The fourth and fifth gate electrodes GE4 and GE5 may overlap each other in the first direction D1. The first and fourth gate electrodes GE1 and GE4 may overlap each other in the second direction D2. The third and fifth gate electrodes GE3 and GE5 may overlap each other in the second direction D2.

A width in the first direction D1 of each of the first, second, and third gate electrodes GE1, GE2, and GE3 may be less than a width in the first direction D1 of each of the fourth and fifth gate electrodes GE4 and GE5. For example, the width in the first direction D1 of each of the fourth and fifth gate electrodes GE4 and GE5 may be about 1.5 times to about 3 times the width in the first direction D1 of each of the first, second, and third gate electrodes GE1, GE2, and GE3.

Gate dielectric layers GI may be provided. The gate dielectric layer GI may separate the gate electrode GE1, GE2, GE3, GE4, or GE5 from the semiconductor pattern SP1, SP2, SP3, SP4, or SP5. The gate dielectric layer GI may cover a top surface, a bottom surface, and a sidewall of the semiconductor pattern SP1, SP2, SP3, SP4, or SP5. The gate dielectric layer GI may include a dielectric material. For example, the gate dielectric layer GI may include oxide.

Gate spacers GS may be provided. A pair of gate spacers may be disposed on opposite sidewalls of the gate electrode GE1, GE2, GE3, GE4, or GE5. The gate spacer GS may extend in the first direction D1. A top surface of the gate spacer GS may be higher than that of the gate electrode GE1, GE2, GE3, GE4, or GE5. The gate spacer GS may include a dielectric material.

Gate capping patterns GP may be provided. The gate capping pattern GP may be provided on the gate electrode GE1, GE2, GE3, GE4, or GE5. The gate capping pattern GP may extend in the first direction D1. A top surface of the gate capping pattern GP may be coplanar with that of the gate spacer GS. The gate capping pattern GP may include a dielectric material. For example, the gate capping pattern GP may include nitride.

Gate separation layers GD may be provided. The gate separation layer GD may be disposed between the gate electrodes GE1, GE2, GE3, GE4, and GE5 that are adjacent to each other in the first direction D1. The gate separation layer GD may separate from each other the gate electrodes GE1, GE2, GE3, GE4, and GE5 that are adjacent to each other in the first direction D1. The gate separation layer GD may include a dielectric material.

The gate separation layer GD may include first gate separation layers GD1 between the first and second gate electrodes GE1 and GE2, second gate separation layers GD2 between the second and third gate electrodes GE2 and GE3, and third gate separation layers GD3 between the fourth and fifth gate electrodes GE4 and GE5.

The third gate separation layer GD3 may be disposed between the first and second gate separation layers GD1 and GD2. A distance in the first direction D1 between the third gate separation layer GD3 and the first separation layer GD1 or the second gate separation layer GD2 may be less than a distance in the first direction D1 between the first gate separation layer GD1 and the second gate separation layer GD2.

The first gate separation layer GD1 may overlap in the second direction D2 with the fourth active pattern AP4, the fourth semiconductor pattern SP4, the fourth gate electrode GE4, and the fourth source/drain structure SS4 which will be discussed below. The second gate separation layer GD2 may overlap in the second direction D2 with the fifth active pattern AP5, the fifth semiconductor pattern SP5, the fifth gate electrode GE5, and a fifth source/drain structure SS5 which will be discussed below. The third gate separation layer GD3 may overlap in the second direction D2 with the second active pattern AP2, the second semiconductor pattern SP2, the second gate electrode GE2, and a second source/drain structure SS2 which will be discussed below.

There may be provided first source/drain structures SS1 overlapping in the third direction D3 with the first active pattern AP1, second source/drain structures SS2 overlapping in the third direction D3 with the second active pattern AP2, third source/drain structures SS3 overlapping in the third direction D3 with the third active pattern AP3, fourth source/drain structures SS4 overlapping in the third direction D3 with the fourth active pattern AP4, and fifth source/drain structures SS5 overlapping in the third direction D3 with the fifth active pattern AP5. A plurality of first source/drain structures SS1 overlap in the third direction D3 with the first active pattern AP1 may be spaced apart from each other in the second direction D2. The source/drain structure SS1, SS2, SS3, SS4, or SS5 may be disposed between corresponding ones of the semiconductor patterns SP1, SP2, SP3, SP4, and SP5, which corresponding semiconductor patterns are adjacent to each other in the second direction D2. The source/drain structure SS1, SS2, SS3, SS4, or SS5 may be contacting corresponding ones of the semiconductor patterns SP1, SP2, SP3, SP4, and SP5.

Each of the source/drain structures SS1, SS2, SS3, SS4, and SS5 may include a lower source/drain pattern LSD and an upper source/drain pattern USD. The lower source/drain pattern LSD and the upper source/drain pattern USD included in one of the source/drain structures SS1, SS2, SS3, SS4, and SS5 may overlap each other in the third direction D3. The lower source/drain pattern LSD and the upper source/drain pattern USD may be epitaxial patterns formed by a selective epitaxial growth process. The lower source/drain pattern LSD and the upper source/drain pattern USD may include a semiconductor material. In some example embodiments, the lower source/drain pattern LSD may have a p-type conductivity, and the upper source/drain pattern USD may have an n-type conductivity. In some example embodiments, the lower source/drain pattern LSD may have an n-type conductivity, and the upper source/drain pattern USD may have a p-type conductivity The first, second, and third source/drain structures SS1, SS2, and SS3 may overlap each other in the first direction D1. The fourth and fifth source/drain structures SS4 and SS5 may overlap each other in the first direction D1. The first and fourth source/drain structures SS1 and SS4 may overlap each other in the second direction D2. The third and fifth source/drain structures SS3 and SS5 may overlap each other in the second direction D2.

A width in the first direction D1 of each of the upper source/drain patterns USD of the first, second, and third source/drain structures SS1, SS2, and SS3 may be less than a width in the first direction D1 of each of the upper source/drain patterns USD of the fourth and fifth source/drain structures SS4 and SS5. For example, the width in the first direction D1 of each of the upper source/drain patterns USD of the fourth and fifth source/drain structures SS4 and SS5 may be about 1.5 times to about 3 times the width in the first direction D1 of each of the upper source/drain patterns USD of the first, second, and third source/drain structures SS1, SS2, and SS3.

A width in the first direction D1 of each of the lower source/drain patterns LSD of the first, second, and third source/drain structures SS1, SS2, and SS3 may be less than a width in the first direction D1 of each of the lower source/drain patterns LSD of the fourth and fifth source/drain structures SS4 and SS5. For example, the width in the first direction D1 of each of the lower source/drain patterns LSD of the fourth and fifth source/drain structures SS4 and SS5 may be about 1.5 times to about 3 times the width in the first direction D1 of each of the lower source/drain patterns LSD of the first, second, and third source/drain structures SS1, SS2, and SS3.

Lower active contacts LAC may be provided. The lower active contact LAC may penetrate the substrate 100 to come into contact with a lower portion of the lower source/drain pattern LSD. Lower vias LV may be provided. The lower via LV may penetrate the second lower dielectric layer 120 to come into contact with the lower active contact LAC. The lower source/drain pattern LSD may be electrically connected through the lower active contact LAC and the lower via LV to the lower power line LP1, LP2, LP3, or LP4 or the lower signal line LS. The lower active contact LAC and the lower via LV may include a conductive material.

At least one of the lower active contacts LAC may be electrically connected to a plurality of lower power lines LP1, LP2, LP3, and LP4. For example, the lower active contact LAC contacting the fourth source/drain structure SS4 may be electrically connected through two lower vias LV to the first and second lower power lines LP1 and LP2.

Lower gate contacts LGC may be provided. The lower gate contact LGC may penetrate the second lower dielectric layer 120 and the substrate 100 to come into contact with a lower portion of the lower electrode LE. The lower electrode LE may be electrically connected through the lower gate contact LGC to the lower signal line LS. The lower gate contact LGC may include a conductive material. In some example embodiments, the lower gate contact LGC may include a plurality of contacts overlapping each other in the third direction D3.

A first interlayer dielectric layer 130 may be provided on the lower source/drain patterns LSD. A second interlayer dielectric layer 140 may be provided on the first interlayer dielectric layer 130. A portion of the first interlayer dielectric layer 130 may be interposed between the upper source/drain pattern USD and the lower source/drain pattern LSD. The first and second interlayer dielectric layers 130 and 140 may include a dielectric material.

A diffusion break dielectric layer 150 may be provided between the first and fourth active patterns AP1 and AP4 and between the third and fifth active patterns AP3 and AP5. The diffusion break dielectric layer 150 may be provided on the device isolation layer ST. The diffusion break dielectric layer 150 may define a double diffusion break region. The diffusion break dielectric layer 150 may include a dielectric material.

A first upper dielectric layer 160 may be provided on the second interlayer dielectric layer 140. A second upper dielectric layer 170 may be provided on the first upper dielectric layer 160. A third upper dielectric layer 180 may be provided on the second upper dielectric layer 170. The first, second, and third upper dielectric layers 160, 170, and 180 may include a dielectric material.

Upper active contacts UAC may be provided. The upper active contact UAC may penetrate the first upper dielectric layer 160 and the second interlayer dielectric layer 140 to come into contact with an upper portion of the upper source/drain pattern USD. Upper vias UV may be provided. The upper via UV may penetrate the second upper dielectric layer 170 to come into contact with the upper active contact UAC. The upper source/drain pattern USD may be electrically connected through the upper active contact UAC and the upper via UV to an upper power line UP1, UP2, UP3, or UP4 or an upper signal line US which will be discussed below. The upper active contact UAC and the upper via UV may include a conductive material.

Upper gate contacts UGC may be provided. The upper gate contact UGC may penetrate the gate capping pattern GP, the first upper dielectric layer 160, and the second upper dielectric layer 170 to come into contact with an upper portion of the upper electrode UE. The upper electrode UE may be electrically connected through the upper gate contact UGC to the upper signal line US which will be discussed below. The upper gate contact UGC may include a conductive material. In some example embodiments, the upper gate contact UGC may include a plurality of contacts overlapping each other in the third direction D3.

The third upper dielectric layer 180 may be provided therein with a first upper power line UP1, a second upper power line UP2, a third upper power line UP3, a fourth upper power line UP4, and upper signal lines US. The second and third upper power lines UP2 and UP3 may be disposed between the first and fourth upper power lines UP1 and UP4. The first, second, third, and fourth upper power lines UP1, UP2, UP3, and UP4 and the upper signal lines US may include a conductive material.

The first, second, third, and fourth upper power lines UP1, UP2, UP3, and UP4 and the upper signal lines US may extend in the second direction D2. A plurality of upper signal lines US may be disposed between two ones of the upper power lines UP1, UP2, UP3, and UP4, which two upper power lines are adjacent to each other in the first direction D1. For example, three upper signal lines US may be disposed between the first and second upper power lines UP1 and UP2. In some example embodiments, the upper power lines UP1, UP2, UP3, and UP4 may be Vss lines, and the lower power lines LP1, LP2, LP3, and LP4 may be Vdd lines. In some example embodiments, the upper power lines UP1, UP2, UP3, and UP4 may be Vdd lines, and the lower power lines LP1, LP2, LP3, and LP4 may be Vss lines.

At least one of the upper active contacts UAC may be electrically connected to a plurality of upper power lines UP1, UP2, UP3, and UP4. For example, the upper active contact UAC contacting the fourth source/drain structure SS4 may be electrically connected through two upper vias UV to the first and second upper power lines UP1 and UP2.

A pitch in the first direction D1 between the upper power lines UP1, UP2, UP3, and UP4 may be the same as a pitch in the first direction D1 between the lower power lines LP1, LP2, LP3, and LP4. The first upper power line UP1 may overlap in the third direction D3 with the first lower power line LP1. The second upper power line UP2 may overlap in the third direction D3 with the second lower power line LP2. The third upper power line UP3 may overlap in the third direction D3 with the third lower power line LP3. The fourth upper power line UP4 may overlap in the third direction D3 with the fourth lower power line LP4.

The first gate separation layer GD1 may overlap in the third direction D3 with the second lower power line LP2 and the second upper power line UP2. The second gate separation layer GD2 may overlap in the third direction D3 with the third lower power line LP3 and the third upper power line UP3. The third gate separation layer GD3 may overlap in the third direction D3 with the lower signal line LS and the upper signal line US. The third gate separation layer GD3 may be disposed between the second and third lower power lines LP2 and LP3 and between the second and third upper power lines UP2 and UP3.

The second upper power line UP2 and the second lower power line LP2 may overlap in the third direction D3 with the fourth active pattern AP4, the fourth semiconductor pattern SP4, the fourth gate electrode GE4, and the fourth source/drain structure SS4. The third upper power line UP3 and the third lower power line LP3 may overlap in the third direction D3 with the fifth active pattern AP5, the fifth semiconductor pattern SP5, the fifth gate electrode GE5, and the fifth source/drain structure SS5.

The first, second, and third semiconductor patterns SP1, SP2, and SP3 may not overlap in the third direction D3 any of the upper power lines UP1, UP2, UP3, and UP4 and the lower power lines LP1, LP2, LP3, and LP4.

The first semiconductor pattern SP1 may have a first sidewall S1 adjacent to the first upper power line UP1 and a second sidewall S2 opposite to the first sidewall S1. The fourth semiconductor pattern SP4 may have a first sidewall S3 adjacent to the first upper power line UP1 and a second sidewall S4 opposite to the first sidewall S3. In some example embodiments, the first sidewall S1 of the first semiconductor pattern SP1 and the first sidewall S3 of the fourth semiconductor pattern SP4 may be disposed on one straight line extending in the second direction D2. A distance in the first direction D1 between the third upper power lines UP3 and the second sidewall S2 of the first semiconductor pattern SP1 may be greater than a distance in the first direction D1 between the third upper power line UP3 and the second sidewall S2 of the fourth semiconductor pattern SP4.

The third semiconductor pattern SP3 may have a first sidewall S5 adjacent to the fourth upper power line UP4 and a second sidewall S6 opposite to the first sidewall S5. The fifth semiconductor pattern SP5 may have a first sidewall S7 adjacent to the fourth upper power line UP4 and a second sidewall S8 opposite to the first sidewall S7. In some example embodiments, the first sidewall S5 of the third semiconductor pattern SP3 and the first sidewall S7 of the fifth semiconductor pattern SP5 may be disposed on one straight line extending in the second direction D2. A distance in the first direction D1 between the second upper power lines UP2 and the second sidewall S6 of the third semiconductor pattern SP3 may be greater than a distance in the first direction D1 between the second upper power line UP2 and the second sidewall S8 of the fifth semiconductor pattern SP5.

The first upper power line UP1 may include a first part UP11 adjacent to the first semiconductor pattern SP1 and a second part UP12 adjacent to the fourth semiconductor pattern SP4. In some example embodiments, a distance in the first direction D1 between the first sidewall S1 of the first semiconductor pattern SP1 and the first part UP11 of the first upper power line UP1 may be the same as a distance in the first direction D1 between the first sidewall S3 of the fourth semiconductor pattern SP4 and the second part UP12 of the first upper power line UP1.

There may be defined a central line CT1 of the first part UP11 included in the first upper power line UP1 and a central line CT2 of the second part UP12 included in the first upper power line UP1. The first upper power line UP1 may be configured such that the central line CT1 of the first part UP11 and the central line CT2 of the second part UP12 may be disposed on one straight line extending in the second direction D2.

In some example embodiments, a distance in the first direction D1 between the first sidewall S1 of the first semiconductor pattern SP1 and the central line CT1 of the first part UP11 included in the first upper power line UP1 may be the same as a distance in the first direction D1 between the first sidewall S3 of the fourth semiconductor pattern SP4 and the central line CT2 of the second part UP12 included in the first upper power line UP1.

The fourth upper power line UP4 may include a first part UP41 adjacent to the third semiconductor pattern SP3 and a second part UP42 adjacent to the fifth semiconductor pattern SP5. In some example embodiments, a distance in the first direction D1 between the first sidewall S5 of the third semiconductor pattern SP3 and the first part UP41 of the fourth upper power line UP4 may be the same as a distance in the first direction D1 between the first sidewall S7 of the fifth semiconductor pattern SP5 and the second part UP42 of the fourth upper power line UP4.

There may be defined a central line CT3 of the first part UP41 included in the fourth upper power line UP4 and a central line CT4 of the second part UP42 included in the fourth upper power line UP4. The fourth upper power line UP4 may be configured such that the central line CT3 of the first part UP41 and the central line CT4 of the second part UP42 may be disposed on one straight line extending in the second direction D2.

In some example embodiments, a distance in the first direction D1 between the first sidewall S5 of the third semiconductor pattern SP3 and the central line CT3 of the first part UP41 included in the fourth upper power line UP4 may be the same as a distance in the first direction D1 between the first sidewall S7 of the fifth semiconductor pattern SP5 and the central line CT4 of the second part UP42 included in the fourth upper power line UP4.

The first, second, third, fourth, and fifth semiconductor patterns SP1, SP2, SP3, SP4, and SP5 may be disposed between the first and fourth upper power lines UP1 and UP4 and between the first and fourth lower power lines LP1 and LP4.

A distance in the first direction D1 between the upper power lines UP1, UP2, UP3, and UP4 may be greater than a width in the first direction D1 of each of the first, second, and third semiconductor patterns SP1, SP2, and SP3. For example, a distance L3 in the first direction D1 between the second and third upper power lines UP2 and UP3 may be greater than the width W1 in the first direction D1 of the first semiconductor pattern SP1.

The distance in the first direction D1 between the upper power lines UP1, UP2, UP3, and UP4 may be greater than a width in the first direction D1 of each of the fourth and fifth semiconductor patterns SP4 and SP5. For example, a distance L3 in the first direction D1 between the second and third upper power lines UP2 and UP3 may be greater than the width W2 in the first direction D1 of the fourth semiconductor pattern SP4.

A length in the first direction D1 of a cell defined by the fourth semiconductor pattern SP4, the fourth source/drain structure SS4, the fourth gate electrode GE4, and the fourth active pattern AP4 may be about 1.5 times a length in the first direction D1 of a cell defined by the first semiconductor pattern SP1, the first source/drain structure SS1, the first source/drain structure SS1, the first gate electrode GE1, and the first active pattern AP1.

In a semiconductor device according to some example embodiments, the first, second, and third semiconductor patterns SP1, SP2, and SP3 and the fourth and fifth semiconductor patterns SP4 and SP5 whose widths are different from those of the first, second, and third semiconductor patterns SP1, SP2, and SP3 may share one or more of the upper conductive lines UP1, UP2, UP3, and UP4 and one or more of the lower conductive lines LP1, LP2, LP3, and LP4, and therefore the number of the upper conductive lines UP1, UP2, UP3, and UP4 and the number of the lower conductive lines LP1, LP2, LP3, and LP4 may become minimum, with the result that the semiconductor device may be simplified in structure and fabrication process. In addition, it may be possible to minimize the number of filler cells in the semiconductor device.

In a semiconductor device according to some example embodiments, a length of three cells defined by the first, second, and third semiconductor patterns SP1, SP2, and SP3 whose width is relatively smaller may be the same as a length of two cells defined by the fourth and fifth semiconductor patterns SP4 and SP5 whose width is relatively larger, and thus there may be an improvement in transistor frequency caused by the fourth and fifth semiconductor patterns SP4 and SP5, a minimization in areas occupied by cells defined by the fourth and fifth semiconductor patterns SP4 and SP5, and a maximization in density of semiconductor patterns in cells defined by the fourth and fifth semiconductor patterns SP4 and SP5.

In a semiconductor device according to some example embodiments, at least one of the upper active contacts UAC may be electrically connected through a plurality of upper vias UV to a plurality of upper power lines UP1, UP2, UP3, and UP4, and it may thus be possible to minimize loss due to resistance of the upper vias UV.

In a semiconductor device according to some example embodiments, at least one of the lower active contacts LAC may be electrically connected through a plurality of lower vias LV to a plurality of lower power lines LP1, LP2, LP3, and LP4, and it may thus be possible to minimize loss due to resistance of the lower vias LV.

Figure 3A:
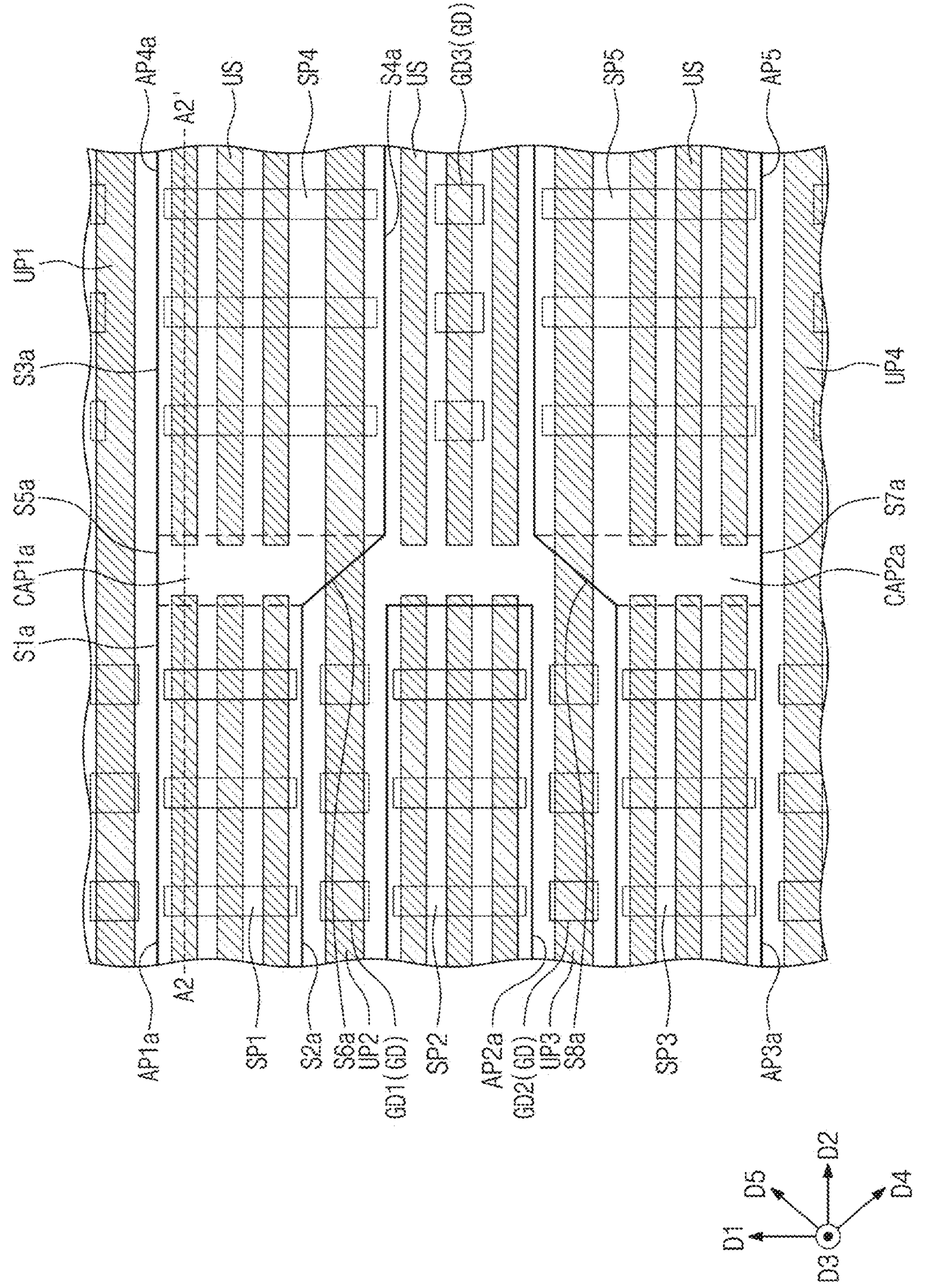
FIG. 3A illustrates a plan view showing a semiconductor device according to some example embodiments.
Figure 3B:
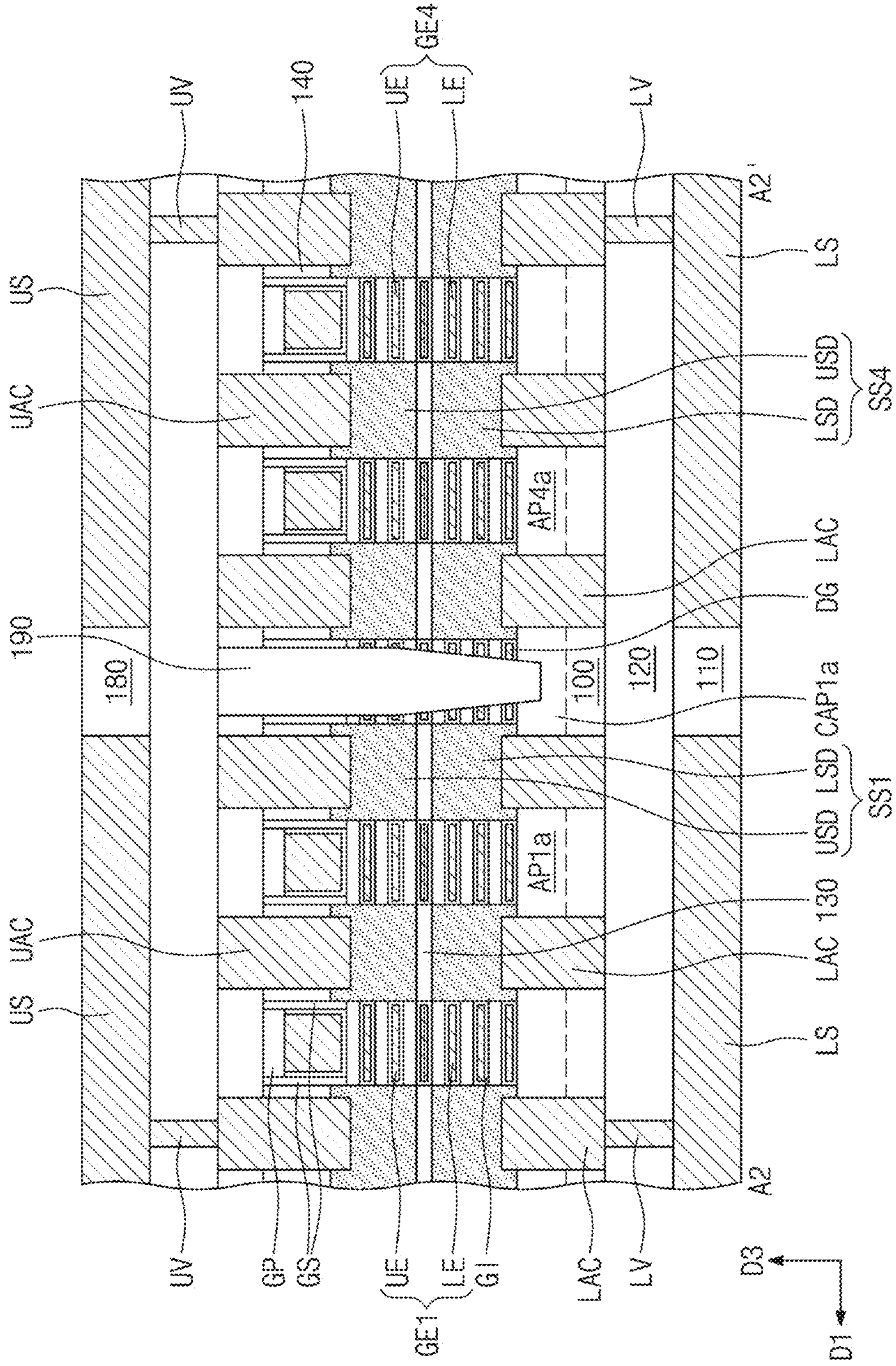
FIG. 3B illustrates a cross-sectional view taken along line A2-A2' of FIG. 3A.

FIG. 3A illustrates a plan view showing a semiconductor device according to some example embodiments. FIG. 3B illustrates a cross-sectional view taken along line A2-A2' of FIG. 3A. Except for the following description, a semiconductor device of FIGS. 3A and 3B may be similar to the semiconductor device of FIGS. 2A to 2F.

Referring to FIGS. 3A and 3B, a semiconductor device may include a first active pattern AP1*a*, a second active pattern AP2*a*, a third active pattern AP3*a*, a fourth active pattern AP4*a*, and a fifth active pattern AP5*a*.

A first connection active pattern CAP1*a* may be provided to connect the first and fourth active patterns AP1*a* and AP4*a* to each other, and a second connection active pattern CAP2*a* may be provided to connect the third and fifth active patterns AP3*a* and AP5*a* to each other.

The first active pattern AP1*a*, the first connection active pattern CAP1*a*, and the fourth active pattern AP4*a* may be connected without boundaries to form a single unitary structure. The first active pattern AP1*a*, the first connection active pattern CAP1*a*, and the fourth active pattern AP4*a* may have their top surfaces that are coplanar with each other. A width in the first direction D1 of the first connection active pattern CAP1*a* may increase in a direction from the first active pattern AP1*a* toward the fourth active pattern AP4*a*.

The first active pattern AP1*a* may have a first sidewall Sla adjacent to the first upper power line UP1 and a second sidewall S2*a* opposite to the first sidewall Sla. The fourth active pattern AP4*a* may have a first sidewall S3*a* adjacent to the first upper power line UP1 and a second sidewall S4*a* opposite to the first sidewall S3*a*. The first connection active pattern CAP1*a* may have a first sidewall S5*a* adjacent to the first upper power line UP1 and a second sidewall S6*a* that connects the second sidewall S2*a* of the first active pattern AP1*a* to the second sidewall S4*a* of the fourth active pattern AP4*a*.

The first sidewall Sla of the first active pattern AP1*a*, the first sidewall S3*a* of the fourth active pattern AP4*a*, and the first sidewall S5*a* of the first connection active pattern CAP1*a* may be coplanar with each other. The first sidewall Sla of the first active pattern AP1*a*, the first sidewall S3*a* of the fourth active pattern AP4*a*, and the first sidewall S5*a* of the first connection active pattern CAP1*a* may be parallel to the second direction D2.

The second sidewall S6*a* of the first connection active pattern CAP1*a* may be parallel to a fourth direction D4. The fourth direction D4 may intersect the first direction D1, the second direction D2, and the third direction D3. For example, the fourth direction D4 may be a horizontal direction intersecting the first and second directions D1 and D2 and is perpendicular to the third direction D3.

The third active pattern AP3*a*, the second connection active pattern CAP2*a*, and the fifth active pattern AP5*a* may be connected without boundaries to form a single unitary structure. A width in the first direction D1 of the second connection active pattern CAP2*a* may increase in a direction from the third active pattern AP3*a* toward the fifth active pattern AP5*a*.

The second connection active pattern CAP2*a* may have a first sidewall S7*a* adjacent to the fourth upper power line UP4 and a second sidewall S8*a* opposite to the first sidewall S7*a*. The second sidewall S8*a* of the second connection active pattern CAP2*a* may be parallel to a fifth direction D5. The fifth direction D5 may intersect the first direction D1, the second direction D2, the third direction D3, and the fourth direction D4. For example, the fifth direction D5 may be a horizontal direction intersecting the first direction D1, the second direction D2, and the fourth direction D4 and is perpendicular to the third direction D3.

A semiconductor device may include a separation dielectric layer 190. The separation dielectric layer 190 may be contacting the first connection active pattern CAP1*a*. The separation dielectric layer 190 may penetrate a dummy gate electrode DG between the first source/drain structure SS1 and the fourth source/drain structure SS4. The separation dielectric layer 190 may define a single diffusion break region. The separation dielectric layer 190 may include a dielectric material.

Figure 4:
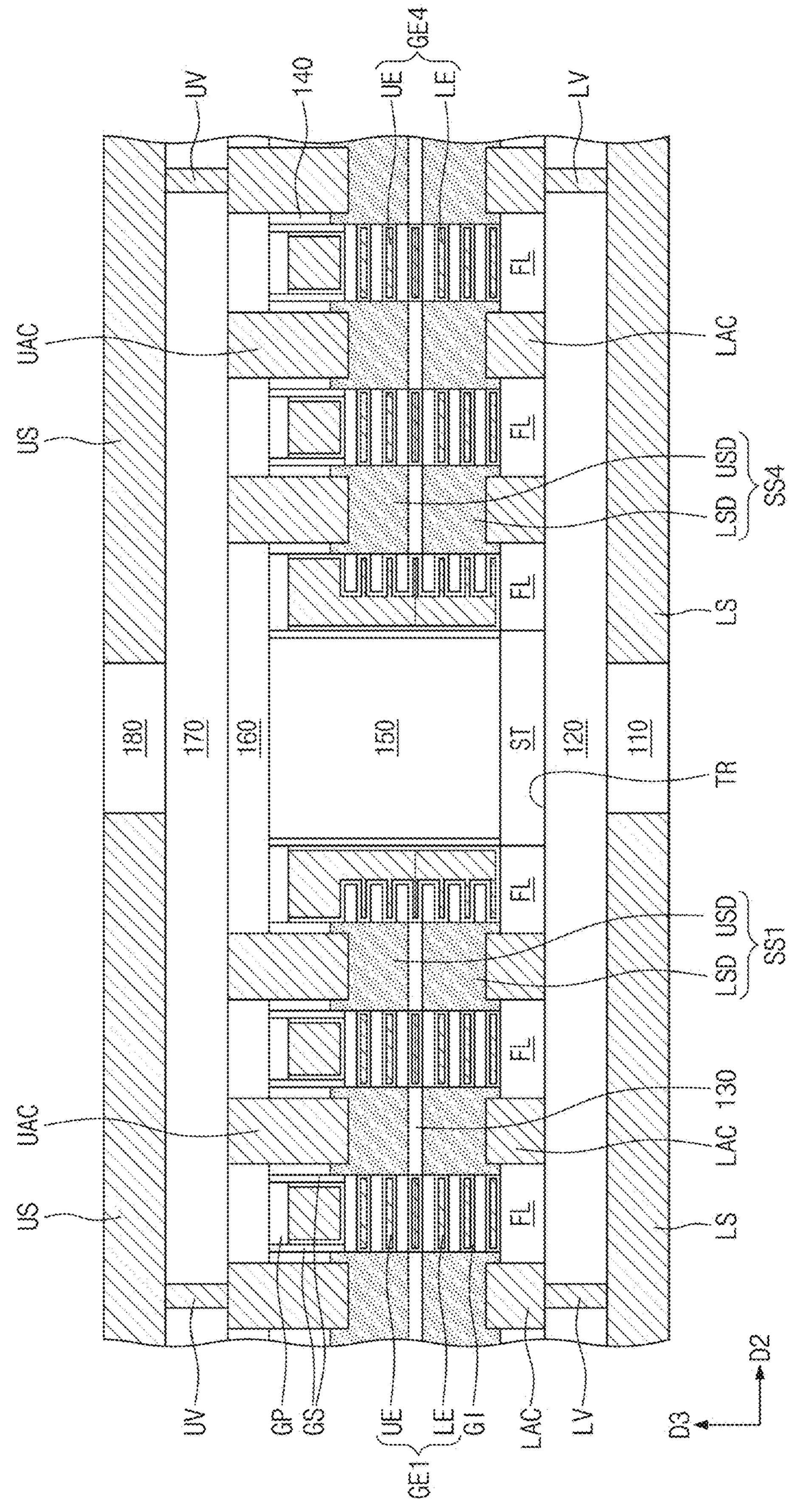
FIG. 4 illustrates a cross-sectional view showing a semiconductor device according to some example embodiments.

FIG. 4 illustrates a cross-sectional view showing a semiconductor device according to some example embodiments. Except for the following description, a semiconductor device of FIG. 4 may be similar to the semiconductor device of FIGS. 2A to 2F.

Referring to FIG. 4, filling dielectric layers FL may be provided on the second lower dielectric layer 120. The filling dielectric layers FL may be spaced apart from each other across the device isolation layer ST. The lower active contact LAC may penetrate in the third direction D3 through the filling dielectric layer FL. The first and fourth source/drain structures SS1 and SS4 and the first and fourth gate electrodes GE1 and GE4 may overlap in the third direction D3 with the filling dielectric layers FL. The filling dielectric layer FL may include a dielectric material.

A source/drain structure SS1 or SS4 may be formed on an active pattern, the active pattern may be removed, and then the filling dielectric layer FL may be formed in an empty space where the active pattern is removed.

In a semiconductor device according to some example embodiments of the present inventive concepts, the number of upper conductive lines and the number of lower conductive lines may become minimal, with the result that the semiconductor device may be simplified in structure and fabrication process. In addition, it may be possible to minimize the number of filler cells in the semiconductor device.

In a semiconductor device according to some example embodiments of the present inventive concepts, cells defined by semiconductor patterns whose widths are relatively smaller and cells defined by semiconductor patterns whose widths are relatively larger may be arranged at a ratio of about 3:2, and thus it may be possible to improve a transistor frequency, to minimize an area occupied by the cells, and to maximize a density of the semiconductor patterns.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%

Although the present invention has been described in connection with the some example embodiments of the present inventive concepts illustrated in the accompanying drawings, it will be understood by one of ordinary skill in the art that variations in form and detail may be made therein without departing from the spirit and essential feature of the present inventive concepts. The above disclosed example embodiments should thus be considered illustrative and not restrictive. Moreover, the example embodiments discussed above may be combined with each other.

What is claimed is:

1. A semiconductor device, comprising:

a first upper power line and a second upper power line extending in a first direction and are spaced apart from each other in a second direction intersecting the first direction;

a first semiconductor pattern;

a second semiconductor pattern spaced apart in the second direction from the first semiconductor pattern;

a third semiconductor pattern spaced apart in the second direction from the second semiconductor pattern;

a fourth semiconductor pattern spaced apart in the first direction from the first semiconductor pattern; and a fifth semiconductor pattern spaced apart in the first direction from the third semiconductor pattern, wherein the first to fifth semiconductor patterns are between the first upper power line and the second upper power line, wherein the second semiconductor pattern is between the first semiconductor pattern and the third semiconductor pattern, and wherein a distance between the first semiconductor pattern and the third semiconductor pattern is greater than a distance between the fourth semiconductor pattern and the fifth semiconductor pattern.

2. The semiconductor device of claim 1, wherein a width in the second direction of each of the first to third semiconductor patterns is less than a width in the second direction of each of the fourth and fifth semiconductor patterns.

3. The semiconductor device of claim 2, wherein the width in the second direction of each of the fourth and fifth semiconductor patterns is 1.5 times to 3 times the width in the second direction of each of the first to third semiconductor patterns.

4. The semiconductor device of claim 1, further comprising a third upper power line and a fourth upper power line between the first upper power line and the second upper power line, wherein the third upper power line overlaps the fourth semiconductor pattern, and wherein the fourth upper power line overlaps the fifth semiconductor pattern.

5. The semiconductor device of claim 4, wherein each of the third and fourth upper power lines are not overlapping any of the first to third semiconductor patterns.

6. The semiconductor device of claim 4, wherein a width in the second direction of each of the first to third semiconductor patterns is less than a distance in the second direction between the third and fourth upper power lines.

7. The semiconductor device of claim 4, wherein a width in the second direction of each of the fourth and fifth semiconductor patterns is greater than a distance in the second direction between the third and fourth upper power lines.

8. A semiconductor device, comprising:

a first semiconductor pattern;

a second semiconductor pattern and a third semiconductor pattern overlapping in a first direction with the first semiconductor pattern;

a fourth semiconductor pattern overlapping in a second direction with the first semiconductor pattern, the second direction intersecting the first direction; and a fifth semiconductor pattern overlapping in the second direction with the third semiconductor pattern, wherein the second semiconductor pattern is between the first semiconductor pattern and the third semiconductor pattern, and wherein a width in the first direction of each of the first to third semiconductor patterns is less than a width in the first direction of each of the fourth and fifth semiconductor patterns.

9. The semiconductor device of claim 8, further comprising:

a first source/drain structure contacting the first semiconductor pattern;

a second source/drain structure contacting the second semiconductor pattern;

a third source/drain structure contacting the third semiconductor pattern;

a fourth source/drain structure contacting the fourth semiconductor pattern; and a fifth source/drain structure contacting the fifth semiconductor pattern, wherein each of the first to fifth source/drain structures includes an upper source/drain pattern and a lower source/drain pattern, wherein the lower source/drain pattern overlaps the upper source/drain pattern in a third direction, and wherein the third direction intersects the first direction and the second direction.

10. The semiconductor device of claim 9, wherein a width in the first direction of each of the first to third source/drain structures is less than a width in the first direction of each of the fourth and fifth source/drain structures.

11. The semiconductor device of claim 9, further comprising:

a first upper power line and a second upper power line extending in the second direction;

an upper active contact contacting the upper source/drain pattern of the fourth source/drain structure;

a first upper via connecting the upper active contact to the first upper power line; and a second upper via connecting the upper active contact to the second upper power line.

12. The semiconductor device of claim 9, further comprising:

a first lower power line and a second lower power line extending in the second direction;

a lower active contact contacting the lower source/drain pattern of the fourth source/drain structure;

a first lower via connecting the lower active contact to the first lower power line; and a second lower via connecting the lower active contact to the second lower power line.

13. The semiconductor device of claim 8, further comprising:

an upper electrode and a lower electrode overlapping the first semiconductor pattern;

an upper gate contact contacting the upper electrode;

a lower gate contact contacting the lower electrode;

an upper signal line contacting the upper gate contact; and a lower signal line contacting the lower gate contact.

14. The semiconductor device of claim 13, wherein the upper electrode and the lower electrode include different conductive materials from each other.

15. The semiconductor device of claim 8, further comprising:

a first gate electrode overlapping in a third direction with the first semiconductor pattern;

a second gate electrode overlapping in the third direction with the second semiconductor pattern;

a third gate electrode overlapping in the third direction with the third semiconductor pattern;

a fourth gate electrode overlapping in the third direction with the fourth semiconductor pattern; and a fifth gate electrode overlapping in the third direction with the fifth semiconductor pattern, wherein the third direction intersects the first direction and the second direction, and wherein a width in the first direction of each of the first to third gate electrodes is less than a width in the first direction of each of the fourth and fifth gate electrodes.

16. A semiconductor device, comprising:

a first source/drain structure;

a first semiconductor pattern contacting the first source/drain structure;

a first gate electrode overlapping the first semiconductor pattern;

a second source/drain structure spaced apart in a first direction from the first source/drain structure;

a second semiconductor pattern contacting the second source/drain structure;

a second gate electrode overlapping the second semiconductor pattern;

a third source/drain structure spaced apart in the first direction from the second source/drain structure;

a third semiconductor pattern contacting the third source/drain structure;

a third gate electrode overlapping the third semiconductor pattern;

a fourth source/drain structure spaced apart in a second direction from the first source/drain structure, the second direction intersecting the first direction;

a fourth semiconductor pattern contacting the fourth source/drain structure;

a fourth gate electrode overlapping the fourth semiconductor pattern;

a fifth source/drain structure spaced apart in the second direction from the third source/drain structure;

a fifth semiconductor pattern contacting the fifth source/drain structure;

a fifth gate electrode overlapping the fifth semiconductor pattern;

a first gate separation layer between the first gate electrode and the second gate electrode;

a second gate separation layer between the second gate electrode and the third gate electrode; and a third gate separation layer between the fourth gate electrode and the fifth gate electrode, wherein each of the first to fifth source/drain structures includes an upper source/drain pattern and a lower source/drain pattern, and wherein the third gate separation layer is between the first gate separation layer and the second gate separation layer.

17. The semiconductor device of claim 16, further comprising:

a first upper power line overlapping the first gate separation layer; and a second upper power line overlapping the second gate separation layer, wherein the third gate separation layer is between the first upper power line and the second upper power line.

18. The semiconductor device of claim 17, further comprising:

a first lower power line overlapping the first gate separation layer; and a second lower power line overlapping the second gate separation layer, wherein the third gate separation layer is between the first lower power line and the second lower power line.

19. The semiconductor device of claim 18, further comprising:

upper signal lines between the first upper power line and the second upper power line; and lower signal lines between the first lower power line and the second lower power line, wherein a number of the upper signal lines between the first upper power line and the second upper power line is greater than a number of the lower signal lines between the first lower power line and the second lower power line.

20. The semiconductor device of claim 17, further comprising a third upper power line and a fourth upper power line spaced apart in the first direction from each other across the first upper power line and the second upper power line, wherein the third upper power line includes a first part adjacent to the first semiconductor pattern and a second part adjacent to the fourth semiconductor pattern, and wherein a central line of the first part of the third upper power line and a central line of the second part of the third upper power line are on one straight line.

* * * * *